United States Patent
Suehiro et al.

(10) Patent No.: US 7,279,719 B2
(45) Date of Patent: Oct. 9, 2007

(54) LIGHT EMITTING DIODE

(75) Inventors: Yoshinobu Suehiro, Aichi-ken (JP); Hideki Mori, Aichi-ken (JP); Tatsuya Takashima, Aichi-ken (JP)

(73) Assignee: Toyoda Gosei Co., Ltd., Nishikasugai-gun, Aichi-ken (JP)

( * ) Notice: Subject to any disclaimer, the term of this patent is extended or adjusted under 35 U.S.C. 154(b) by 838 days.

(21) Appl. No.: 10/393,024

(22) Filed: Mar. 21, 2003

(65) Prior Publication Data

US 2003/0201451 A1    Oct. 30, 2003

(30) Foreign Application Priority Data

Apr. 5, 2002    (JP)    ............... 2002-103977

(51) Int. Cl.
*H01L 29/22*    (2006.01)
(52) U.S. Cl. .................. 257/98; 257/99; 257/100; 257/E33.061; 257/E33.068; 257/E33.072; 313/501; 313/502; 313/503; 428/690; 428/917

(58) Field of Classification Search .............. 257/99
See application file for complete search history.

(56) References Cited

U.S. PATENT DOCUMENTS 5,998,925 A    12/1999   Shimizu et al.
6,155,699 A  * 12/2000   Miller et al. ............. 362/293

FOREIGN PATENT DOCUMENTS

JP            2000022220 A  *  1/2000

* cited by examiner

*Primary Examiner*—Sue A. Purvis
*Assistant Examiner*—Leslie Pilar Cruz
(74) *Attorney, Agent, or Firm*—McGinn IP Law Group, PLLC

(57) ABSTRACT

A counter reflecting surface is provided opposite to a light emitting element in its light emitting surface. A side reflecting member having an inclined reflecting surface is provided apart from and so as to surround the light emitting element. A phosphor layer is provided on the counter reflecting surface and the reflecting surface of the side reflecting member.

18 Claims, 3 Drawing Sheets

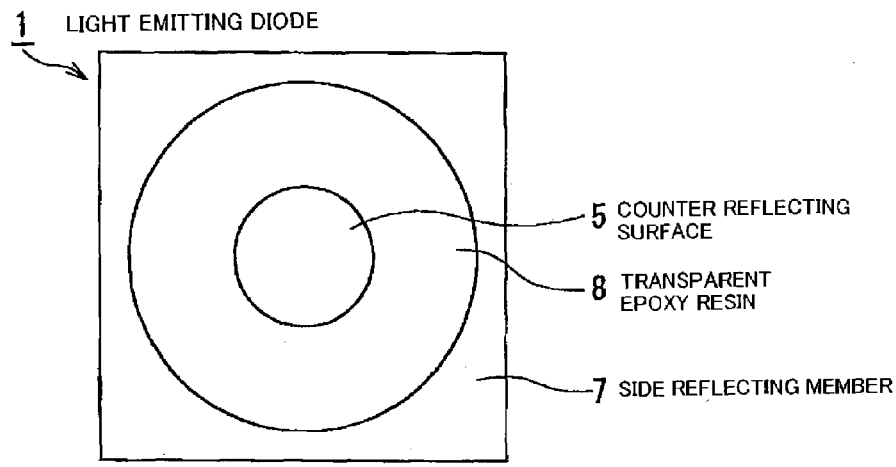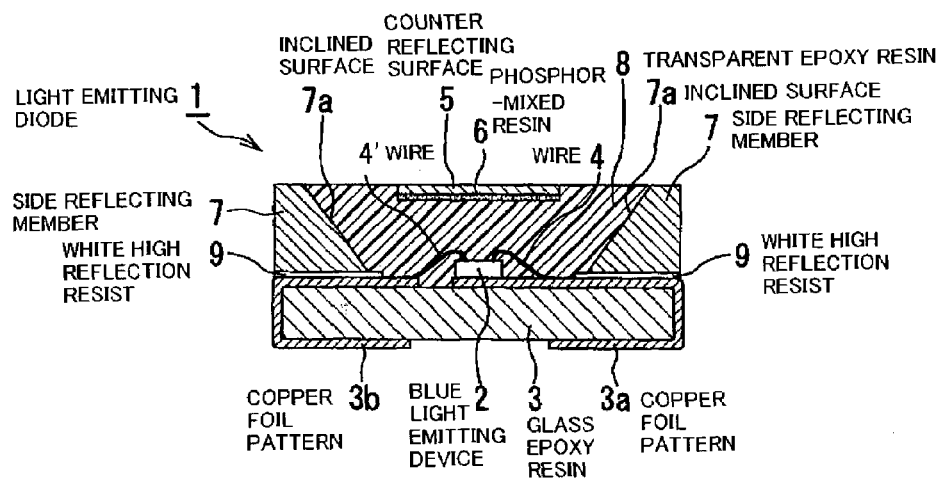

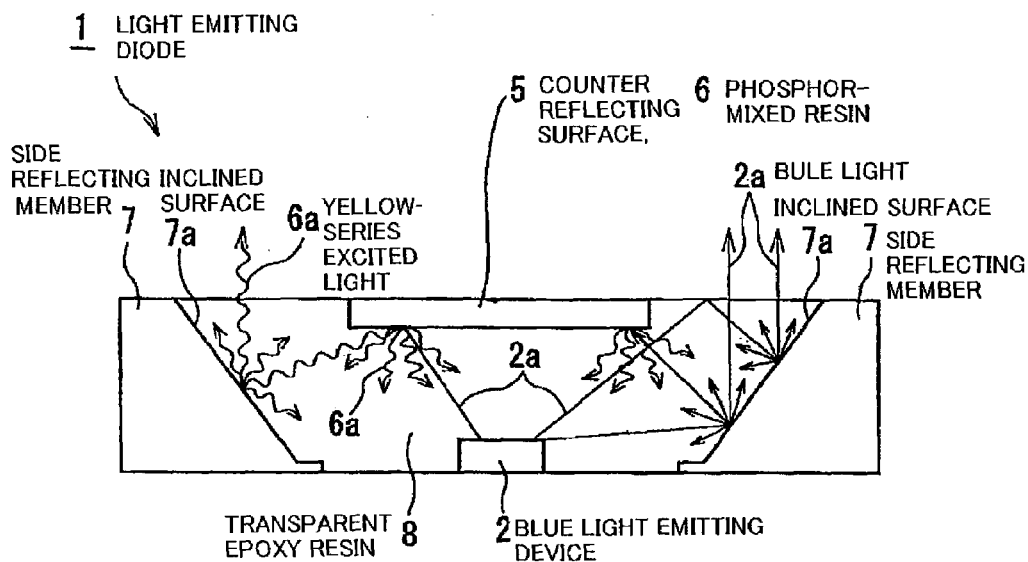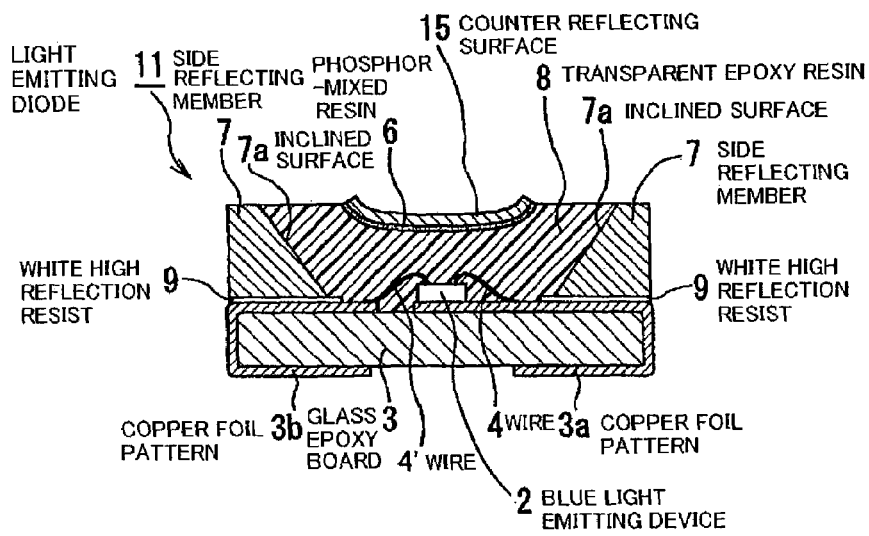

LIGHT EMITTING DIODE

The present application is based on Japanese Patent Application No. 2002-103977, the entire contents of which are incorporated herein by reference.

BACKGROUND OF THE INVENTION

1. Field of the Invention

The invention relates to a light emitting diode including a light emitting element and a phosphor layer. More particularly, the invention is concerned with a light emitting diode including a light emitting element and a phosphor layer in which the quantity of light and fluorescence attenuated by light absorption can be reduced and the efficiency of radiating the light to the outside of the light emitting diode can be enhanced.

In this specification, an LED chip per se is referred to as "light emitting element," and the whole system including an LED chip-mounted package resin or lens system or other optical system is referred to as "light emitting diode" or "LED."

2. Related Art

A light source comprising a blue light emitting element sealed with a phosphor-containing transparent resin by molding has hitherto been used as a white light source. In this white light source, the blue light emitting element emits blue light which is mixed with yellow-series light given off from the phosphor upon excitation with the blue light to provide white light. This conventional white light source, however, is disadvantageous in that light absorption by the blue light emitting element and light absorption by the phosphor layer are so large that white light takeout efficiency is low. Specifically, a part of the light emitted from the blue light emitting element is reflected from the phosphor and is again returned to the blue light emitting element. The inside of the blue light emitting element refracts light highly. Therefore, the returned light is less likely to go outside the blue light emitting element and thus is absorbed in its large proportion in the blue light emitting element. Further, light, which is to be passed through the phosphor layer and to be radiated to the outside of the light emitting diode, is partially absorbed in the phosphor layer and thus is attenuated before being externally radiated.

On the other hand, the inside of the phosphor layer in its portion adjacent to the blue light emitting element is irradiated with blue light, emitted from the blue light emitting element, at high irradiation density. Therefore, a large proportion of yellow-series light given off from the phosphor layer in its portion adjacent to the blue light emitting element upon excitation with the blue light emitted from the blue light emitting element is incident to the blue light emitting element. Here again, the yellow-series light incident to the light emitting element is less likely to go outside the blue light emitting element and thus is absorbed in its large proportion in the blue light emitting element. Further, the other part of the yellow-series light, which is to be passed through the phosphor layer and to be radiated to the outside of the light emitting diode, is partially absorbed in the phosphor layer and thus is attenuated before being externally radiated.

As is apparent from the foregoing description, according to the conventional light emitting diode, the blue light emitting element is provided in intimate contact with the phosphor layer. Because of this construction, a part of blue light emitted from the blue light emitting element is reflected from the phosphor and is returned to and is disadvantageously absorbed in its large proportion in the blue light emitting element. Likewise, a part of yellow-series light emitted from the phosphor upon excitation with the blue light emitted from the blue light emitting element is returned to and is disadvantageously absorbed in its large proportion in the blue light emitting element. Further, the blue light and yellow-series light, which are passed through the phosphor layer, are attenuated by absorption in the thick phosphor layer during the passage through the phosphor layer. Due to the occurrence of the above unfavorable phenomena, the efficiency of radiation of white light provided by mixing of the blue light with the yellow-series excited light to the outside of the light emitting diode is low.

SUMMARY OF THE INVENTION

The present inventors have made extensive and intensive studies with a view to solving the above problems of the prior art and, as a result, have succeeded in reducing the quantity of the light emitting element-originated light returned to and absorbed in the light emitting element, and, at the same time, the quantity of the phosphor layer-originated yellow-series excited light incident to and absorbed in the light emitting element, for example, by the provision of the phosphor layer apart from the light emitting element. The present inventors have further succeeded in reducing the quantity of the light emitting element-originated blue light absorbed in the phosphor layer and the quantity of the phosphor layer-originated excited yellow-series light absorbed in the phosphor layer, by forming the phosphor layer on a reflecting material. The invention has been made based on such finding.

Accordingly, it is an object of the invention to provide a light emitting diode in which the quantity of light emitting element-originated light returned to and absorbed in the light emitting element and the quantity of phosphor layer-originated excited light incident to and absorbed in the light emitting element can be reduced and, at the same time, the quantity of the light emitting element-originated light absorbed in the phosphor layer and the quantity of the phosphor layer-originated excited light absorbed in the phosphor layer can be reduced.

The above object can be attained by the following features of the invention.

A light emitting diode comprising:
 a light emitting element;
 a counter reflecting surface which is provided opposite to a light emitting surface of the light emitting element; and
 a side reflecting member which has an inclined reflecting surface,
 a phosphor layer being provided on at least one of the counter reflecting surface and the reflecting surface of the side reflecting member.

In the light emitting diode, a light transparent material may be provided for sealing the light emitting element. As the counter reflecting surface, the interface reflection of the light transparent material may be utilized. The counter reflecting surface may be a metallic reflecting surface. The phosphor layer may be provided on the reflecting surface of the counter reflecting surface. The phosphor layer may also be provided on the reflecting surface of the side reflecting member.

The above object can also be attained by the following features of the invention.

A light emitting diode comprising:
 a light emitting element;

a first reflecting surface which is provided opposite to a light emitting surface of the light emitting element; and a second reflecting surface which is provided so as to mainly direct light from the first reflecting surface toward the outside of the light emitting diode, a phosphor layer being provided on at least one of the first reflecting surface and the second reflecting surface.

In the light emitting diode, the first reflecting surface may be a reflecting surface of a counter reflector. The counter reflector may be made of a metallic material. The center portion of the counter reflector may be curved in a convex form toward a light emitting surface of the light emitting element. The phosphor layer may be provided on the first reflecting surface. The second reflecting surface may be an inclined reflecting surface of a side reflecting member provided around the light emitting element. The side reflecting member may be made of a metallic material. The phosphor layer may be provided on the second reflecting surface. The light emitting element may be sealed with a light transparent material. The light transparent material may be an epoxy resin.

BRIEF DESCRIPTION OF THE DRAWINGS

The invention will be explained in more detail in conjunction with the appended drawings, wherein:

FIG. 1A is a plan view showing the whole construction of a first preferred embodiment of the light emitting diode according to the invention, and FIG. 1B a longitudinal sectional view of the first preferred embodiment of the light emitting diode according to the invention;

FIG. 2 is a diagram showing an optical path of the first preferred embodiment of the light emitting diode according to the invention;

FIG. 3 is a longitudinal sectional view of a second preferred embodiment of the light emitting diode according to the invention;

DESCRIPTION OF THE PREFERRED EMBODIMENTS

Figure 4:
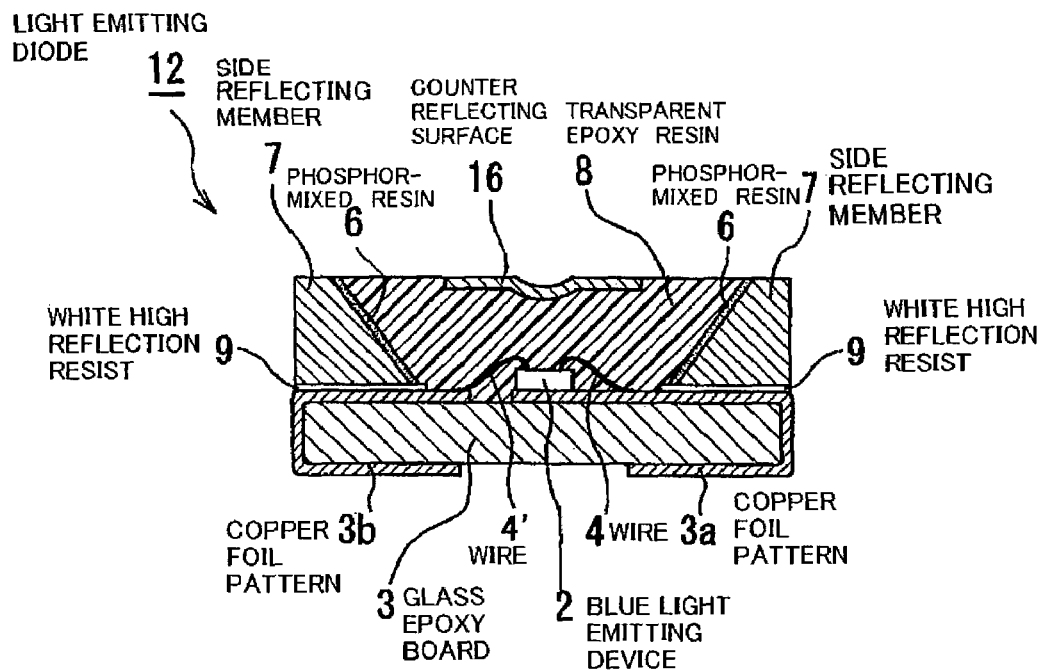
FIG. 4 is a longitudinal sectional view of a third preferred embodiment of the light emitting diode according to the invention.

Preferred embodiments of the invention will be explained in conjunction with the accompanying drawings.

First Preferred Embodiment

The first preferred embodiment of the light emitting diode according to the invention will be first explained in conjunction with FIGS. 1A, 1B and 2. FIG. 1A is a plan view showing the whole construction of the first preferred embodiment of the light emitting diode according to the invention, and FIG. 1B a longitudinal sectional view of the first preferred embodiment of the light emitting diode according to the invention. FIG. 2 is a diagram showing an optical path of the first preferred embodiment of the light emitting diode according to the invention.

A light emitting diode 1 as the first preferred embodiment of the light emitting diode according to the invention shown in FIGS. 1A and 1B includes leads for supplying electric power to a blue light emitting element (hereinafter referred to also simply as "light emitting element") 2. The leads have been prepared by printing copper foil patterns 3a, 3b on a glass epoxy board 3. The light emitting element 2 is mounted on the leading end of the copper foil pattern 3a. One of two electrodes provided on the top surface of the light emitting element 2 is connected to the copper foil pattern 3a through a wire 4, and the other electrode is connected to the copper foil pattern 3b through a wire 4'. Further, a side reflecting member 7 formed of an aluminum material is fixed to the outer periphery portion of a glass epoxy board 3. In this case, a white high reflection resist 9 is interposed between the side reflecting member 7 and the copper foil patterns 3a, 3b provided on the glass epoxy board 3. A highly reflective surface of an inclined surface 7a is provided on the inner periphery of the side reflecting member 7. The inside of the light emitting diode is sealed with a transparent epoxy resin 8 as a light transparent material. A counter reflector of an aluminum sheet as a counter reflecting surface 5 is disposed in the light emitting diode at its center portion which is opposite to the light emitting surface of the light emitting element 2 so that the highly reflective surface of the counter reflecting surface 5 faces downward. A phosphor-mixed resin 6 as a phosphor layer is coated onto one side of the counter reflector.

An optical path at the time of the emission of white light in the light emitting diode 1 as the first preferred embodiment of the light emitting diode according to the invention having the above construction will be explained in conjunction with FIG. 2.

As shown in FIG. 2, blue light 2a applied from the light emitting element 2 to the counter reflecting surface 5 excites the phosphor contained in the phosphor-mixed resin 6 provided on the surface of the counter reflecting surface 5 to provide yellow-series excited light 6a. In the yellow-series excited light 6a, a light portion, which goes toward the side reflecting member 7, is reflected upward from the inclined surface 7a and is radiated outside the light emitting diode 1. A blue light portion, which is applied from the light emitting element 2 to the interface of the transparent epoxy resin 8, is totally reflected, reaches the side reflecting member 7, and is reflected upward from the inclined surface 7a, and the blue light 2a as such is radiated outside the light emitting diode 1. Further, the major part of the blue light 2a, which is emitted from the light emitting element 2, directly reaches the side reflecting member 7, and is reflected from the inclined surface 7a, is reflected upward and is radiated outside the light emitting diode 1. A part of the blue light 2a goes toward the counter reflecting surface 5 and is hit against the phosphor-mixed resin 6 provided on the surface portion of the light emitting diode to excite the phosphor and to give off yellow-series excited light 6a from the phosphor.

Thus, in LED 1, since the phosphor-mixed resin 6 as the phosphor layer is not in intimate contact with the light emitting element 2, the proportion of blue light 2a, which is returned to and is absorbed in the inside of the light emitting element 2, can be significantly reduced, and, at the same time, the proportion of yellow-series excited light 6a, which is incident to and is absorbed in the inside of the light emitting element 2, can be significantly reduced. Further, the phosphor layer 6 is provided on the counter reflecting surface 5, and, upon the application of blue light 2a from the light emitting element 2 to the phosphor layer 6, the yellow-series excited light 6a is given off from the blue light applied surface. Therefore, the quantity of the blue light 2a absorbed in the phosphor layer 6 and the quantity of the yellow-series excited light 6a absorbed in the phosphor layer 6 can be reduced as compared with the case where the phosphor layer is in intimate contact with the light emitting element.

Accordingly, the blue light 2a and the yellow-series excited light 6a, which have been efficiently radiated outside LED 1, are mixed together to provide white light. Thus, LED 1 functions as a high-brightness white light source.

Since the large part of the blue light 2a is reflected from the surface of phosphor-mixed resin 6 as the phosphor layer, the quantity of the blue light 2a absorbed in the phosphor-mixed resin as the phosphor layer is small. Further, since a large quantity of light is given off from the surface of the phosphor layer as a result of excitation of the phosphor with the blue light 2a, the yellow-series excited light 6a is likely to be radiated outside LED 1 without causing significant light absorption.

Second Preferred Embodiment

Next, the second preferred embodiment of the light emitting diode according to the invention will be explained in conjunction with FIG. 3. FIG. 3 is a longitudinal sectional view of the second preferred embodiment of a light emitting diode according to the invention. In FIG. 1 showing the first preferred embodiment of the light emitting diode according to the invention and FIG. 3, like parts are identified with the same reference numerals, and the overlapped explanation thereof will be omitted.

As shown in FIG. 3, a light emitting diode 11 as the second preferred embodiment of the light emitting diode according to the invention is different from the light emitting diode 1 as the first preferred embodiment of the light emitting diode according to the invention in that a counter reflector constituting the counter reflecting surface 15 is curved in a convex form downward. According to this construction, the proportion of blue light, which goes toward the side reflecting member 7, and the proportion of yellow-series excited light, which goes toward the side reflecting member 7, can be increased, and the quantity of blue light, which is reflected upward from the inclined surface 7a and is radiated outside the light emitting diode 11, and the quantity of yellow-series excited light, which is reflected upward from the inclined surface 7a and is radiated outside the light emitting diode 11, can be increased. Thus, LED 11 can function as a higher-brightness white light source.

Third Preferred Embodiment

Next, the third preferred embodiment of the light emitting diode according to the invention will be explained in conjunction with FIG. 4. FIG. 4 is a longitudinal sectional view of the third preferred embodiment of the light emitting diode according to the invention. In FIG. 1 showing the first preferred embodiment of the light emitting diode according to the invention and FIG. 4, like parts are identified with the same reference numerals, and the overlapped explanation thereof will be omitted.

As shown in FIG. 4, a light emitting diode 12 as the third preferred embodiment of the light emitting diode according to the invention is different from the first preferred embodiment of the light emitting diode 1 in that a phosphor-mixed resin 6 as the phosphor layer is coated on the side reflecting member 7 in its reflecting surface and in that the center portion of a counter reflector as a counter reflecting surface 16 is curved in a convex form downward.

According to this construction, the major part of blue light applied from the light emitting element 2 to the counter reflecting surface 16 is reflected and goes to the side reflecting member 7, and blue light, which is deviated from the counter reflecting surface 16 and goes outside the counter reflecting surface 16, is also totally reflected from the interface of the transparent epoxy resin 8 and goes toward the side reflecting member 7. Thus, the major part of blue light emitted from the light emitting element 2 goes toward the side reflecting member 7. Since a phosphor-mixed resin 6 as a phosphor layer is coated onto the reflecting surface of the side reflecting member 7, blue light applied to the phosphor layer 6 induces emission of yellow-series excited light from the blue light applied surface. Therefore, the quantity of blue light absorbed in the phosphor layer 6 and yellow-series excited light absorbed in the phosphor layer 6 can be reduced. Further, the major part of the blue light reflected from the reflecting surface of the side reflecting member 7 and yellow-series excited light is radiated outside the interface of the transparent epoxy resin 8 provided around the periphery of the counter reflecting surface 16.

As described above, in LED 12 as the third preferred embodiment of the light emitting diode according to the invention, the major part of blue light emitted from the blue light emitting element 2 is applied to the reflecting surface of the side reflecting member 7 with the phosphor-mixed resin 6 coated thereon. The LED 12 can realize a white light source which can efficiently radiate high-brightness white light outside the LED 12.

Fourth Preferred Embodiment

Figure 5:
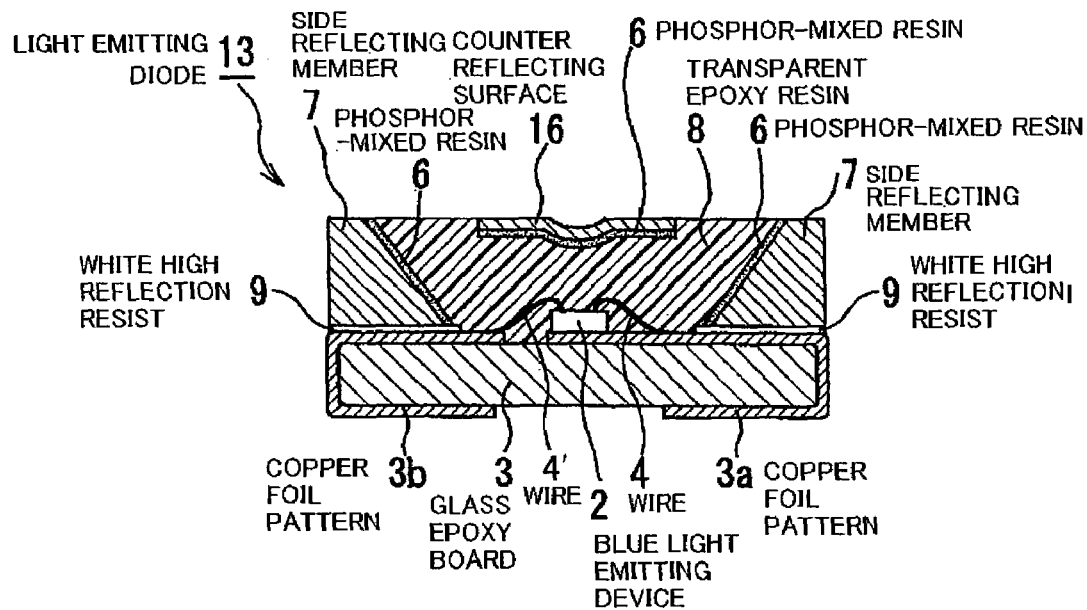
FIG. 5 is a longitudinal sectional view of a fourth preferred embodiment of the light emitting diode according to the invention.

Next, the fourth preferred embodiment of the light emitting diode according to the invention will be explained in conjunction with FIG. 5. FIG. 5 is a longitudinal sectional view of the fourth preferred embodiment of the light emitting diode according to the invention. In FIG. 4 showing the third preferred embodiment of the light emitting diode according to the invention and FIG. 5, like parts are identified with the same reference numerals, and the overlapped explanation thereof will be omitted.

As shown in FIG. 5, a light emitting diode 13 as the fourth preferred embodiment of the light emitting diode according to the invention is different from the light emitting diode 12 as the third preferred embodiment of the light emitting diode according to the invention in that the phosphor-mixed resin 6 as the phosphor layer is coated onto the reflecting surface of the side reflecting member 7, as well as onto the reflecting surface (lower surface) of the counter reflector as the counter reflecting surface 16.

According to this construction, blue light emitted and applied from the light emitting element 2 toward the counter reflecting surface 16 is applied to the phosphor-mixed resin 6 as the phosphor layer to excite the phosphor, and, consequently, yellow-series excited light is given off from the blue light applied surface. Therefore, the quantity of blue light and yellow-series excited light absorbed in the phosphor layer 6 can be reduced as compared with the case where the phosphor layer is in intimate contact with the light emitting element. The major part of blue light reflected from the counter reflecting surface 16 goes to the side reflecting member 7, and blue light, which is deviated from the counter reflecting surface 16 and goes to the outside of the counter reflecting surface 16, is also totally reflected from the interface of the transparent epoxy resin 8 and goes toward the side reflecting member 7. Since a phosphor-mixed resin 6 as a phosphor layer is coated onto the reflecting surface of the side reflecting member 7, blue light applied to the phosphor layer 6 excites the phosphor and, consequently, yellow-series excited light is given off from the blue light applied surface. Therefore, the quantity of blue light absorbed in the phosphor layer 6 and yellow-series excited light absorbed in the phosphor layer 6 can be reduced. Further, the major part of the blue light reflected from the reflecting surface of the side reflecting member 7 and yellow-series excited light is radiated outside the interface of the transparent epoxy resin 8 provided around the periphery of the counter reflecting surface 16.

Thus, in LED 13 as the fourth preferred embodiment of the light emitting diode according to the invention, blue light emitted from the light emitting element 2 is applied twice to the phosphor layer 6 and is then radiated outside LED 13. Therefore, the quantity of the yellow-series excited light is increased, and, thus, the wavelength of light radiated to the outside of the light emitting diode is shifted to longer wavelength side. Further, since blue light is applied twice to the phosphor layer 6, color reproduction can be improved. Furthermore, the proportion of blue light, which as such is reflected from the side reflecting member 7 or the counter reflecting surface 16, can be varied by regulating the thickness of the phosphor-mixed resin 6 as the phosphor layer provided on the side reflecting member 7 and the thickness of the phosphor-mixed resin 6 as the phosphor layer provided on the counter reflecting surface 16. Thus, color tone of light emitted from LED 13 can be easily varied. This can realize a light emitting diode which can emit not only white light but also other various color lights including red, green, and blue color lights.

In each of the above preferred embodiments, a blue light emitting element has been used as a light emitting element, and a phosphor, which gives off yellow-series fluorescence upon exposure to blue light, has been used. However, it should be noted that light emitting elements, which emit any color including ultraviolet light emitting elements, may be used so far as the emitted light has a wavelength which can excite the phosphor. Phosphors, which give off fluorescence having any color, may be used. Further, in each of the preferred embodiments, a transparent epoxy resin has been used as the light transparent material for sealing the light emitting element and the like in LED. However, other materials including transparent silicone resins may also be used.

Further, a highly reflective aluminum sheet has been used as the metallic reflecting surface. However, other metallic sheets or metal vapor deposited films may also be used. Furthermore, an aluminum material has been used as a material for the counter reflecting surface and the side reflecting member. However, any material including other metals may be used so far as the material has high reflectance.

The construction of the lead part by printing copper foils 3a, 3b on the glass epoxy board 3 in each of the above preferred embodiments can offer such an inherent effect that surface mounting is advantageously easy.

Further, also for other parts of the light emitting diode, the construction, form, necessary number, material, size, connection relationship and the like are not limited to those in the above preferred embodiments.

The invention has been described in detail with particular reference to preferred embodiments, but it will be understood that variations and modifications can be effected within the scope of the invention as set forth in the appended claims.

Specifically, according to the following preferred idem (1) of the invention, there is provided a light emitting diode comprising:

a light emitting element; a counter reflecting surface which is provided opposite to a light emitting surface of the light emitting element; and a side reflecting member which is provided apart from and so as to surround the light emitting element and has an inclined reflecting surface, a phosphor layer being provided on at least one of the counter reflecting surface and the reflecting surface of the side reflecting member.

According to this construction, light emitted from the light emitting element is reflected from the counter reflecting surface, is further reflected from the side reflecting member, and is radiated outside the light emitting diode. Here a phosphor layer is provided on at least one of the counter reflecting surface and the reflecting surface of the side reflecting member, and the light emitted from the light emitting element excites the phosphor layer to give off fluorescence. The fluorescence is mixed with the light emitted from the light emitting element to provide light having a predetermined color which is then radiated outside the light emitting diode. The light emitting element is provided apart from the phosphor layer. Therefore, the proportion of light, which is returned to and absorbed in the light emitting element, in light emitted from the light emitting element and reflected from the phosphor can be significantly reduced. At the same time, the proportion of light, which is incident to and absorbed in the light emitting element, in excited light can also be significantly reduced. Further, the phosphor layer is provided on the reflecting surface, and, upon the application of light to the phosphor layer, the phosphor layer is excited to give off excited light from the light applied surface. Therefore, in the light emitted from the light emitting element and the excited light, the proportion of light absorbed in the phosphor layer can be significantly reduced.

Thus, the light emitting diode is advantageous in that, by virtue of the provision of the phosphor layer apart from the light emitting element, the quantity of the light emitting element-originated light returned to and absorbed in the light emitting element can be reduced and, at the same time, the quantity of the phosphor layer-originated yellow-series excited light incident to and absorbed in the light emitting element can be reduced. Further, the quantity of the light emitting element-originated blue light absorbed in the phosphor layer and the quantity of the phosphor layer-originated excited yellow-series light absorbed in the phosphor layer can be reduced by forming the phosphor layer on a reflecting surface.

(2) The light emitting diode according to the above item (1), which further comprises a light transparent material which seals the light emitting element.

According to this construction, the quantity of light emitted from the light emitting element is about twice that in the case where the light emitting element is not sealed. Therefore, the quantity of fluorescence given off upon excitation of the phosphor layer with the light emitted from the light emitting element is approximately doubled, and the quantity of light radiated from the light emitting diode to the outside of the light emitting diode can also be significantly increased. The sealing can also improve the service life of the light emitting element.

Thus, an excellent light emitting diode can be provided in which a large quantity of light can be radiated and the service life of the light emitting element can be prolonged.

(3) The light emitting diode according to the above item (2), the counter reflecting surface utilizes the interface reflection of the light transparent material.

According to this construction, in the light emitted from the light emitting surface of the light emitting element, a light part, which is incident substantially perpendicularly to the interface of the light transparent material, as such is radiated through the interface to the outside of the light emitting diode. On the other hand, a light part, which is incident obliquely to the interface of the light transparent material at the critical angle or larger, is totally reflected from the interface and goes toward the side reflecting member. Likewise, even when the incident angle is not the critical angle or larger, a part of light, which is incident obliquely to the interface of the light transparent material, is reflected from the interface. Thus, the utilization of the interface of the light transparent material as the counter reflecting surface can eliminate the need to newly prepare the counter reflecting surface using a metallic material and the like. Therefore, the preparation of the light emitting diode can be simplified.

Thus, a light emitting diode can be easily prepared by utilizing the interface of the light transparent material as the counter reflecting surface.

(4) The light emitting diode according to the above item (1) or (2), wherein the counter reflecting surface is a metallic reflecting surface.

Here the metallic reflecting surface may be, for example, a metallic sheet, such as an aluminum sheet, or a metal vapor deposited film.

Since the metallic reflecting surface is highly reflective, light emitted from the light emitting surface of the light emitting element can go toward the side reflecting member with small reflection loss. Therefore, the quantity of excited light given off by the phosphor layer is also increased, and the quantity of light, which is emitted from the light emitting element and is radiated to the outside of the light emitting diode, and the quantity of excited light radiated to the outside of the light emitting diode are also increased.

Thus, the use of a highly reflective metallic reflecting surface can provide a light emitting diode having further enhanced efficiency of radiating light to the outside of the light emitting diode.

(5) The light emitting diode according to any one of the above items (1) to (4), wherein the phosphor layer is provided on the reflecting surface of the counter reflecting surface.

Since the counter reflecting surface is provided opposite to the light emitting surface of the light emitting element, the major part of light emitted from the light emitting element is applied to the counter reflecting surface. Therefore, the quantity of fluorescence given off upon the excitation of the phosphor layer upon the application of light to the phosphor layer on the reflecting surface is also increased.

Thus, a light emitting diode, which can increase the quantity of fluorescence given off by excitation of the phosphor layer, can be provided.

(6) The light emitting diode according to any one of the above items (1) to (4), wherein the phosphor layer is provided on the reflecting surface of the side reflecting member.

According to this construction, since the reflecting surface of the side reflecting member has been inclined, light, which has been hit against the reflecting surface, is radiated from the periphery of the counter reflecting surface to the outside of the light emitting diode. Therefore, the provision of a phosphor layer on the reflecting surface of the side reflecting member allows fluorescence, given off by excitation of the phosphor layer upon the application of the light emitting element to the phosphor layer, to be radiated to the outside of the light emitting diode through the smallest distance. Accordingly, even when the inside of the light emitting diode is sealed with a light transparent material by molding, the light is radiated outside the light emitting diode without significant light attenuation caused by light absorption. This contributes to an enhancement in the efficiency of radiating the light to the outside of the light emitting diode.

Thus, a light emitting diode can be provided in which the quantity of fluorescence attenuated by light absorption can be reduced and the efficiency of radiating the light to the outside of the light emitting diode can be enhanced.

What is claimed is:

1. A light emitting diode comprising:
   a light emitting element a light emitting window;
   a counter reflecting surface which is provided opposite to a light emitting surface of the light emitting element wherein the light emitting surface of the light emitting element is provided opposite to the light emitting window;
   a side reflecting member comprising an inclined reflecting surface; and
   a phosphor layer being provided on the reflecting surface of the side reflecting member.

2. The light emitting diode according to claim 1, wherein the counter reflecting surface comprises a metallic reflecting surface.

3. The light emitting diode according to claim 1, wherein the phosphor layer is provided on the reflecting surface of the counter reflecting surface.

4. The light emitting diode according to claim 1, further comprising a light transparent material in contact with the light emitting element.

5. The light emitting diode according to claim 4, wherein the counter reflecting surface utilizes an interface reflection of the light transparent material.

6. A light emitting diode comprising:
   a light emitting element;
   a first reflecting surface which is provided opposite to a light emitting surface of the light emitting element, comprising a reflecting surface of a counter reflector;
   a second reflecting surface which is provided so as to mainly direct light from the first reflecting surface toward the outside of the light emitting diode; and
   a phosphor layer being provided on at least one of the first reflecting surface and the second reflecting surfaces,
   wherein a center portion of the counter reflector is curved in a convex form toward the light emitting surface of the light emitting element.

7. The light emitting diode according to claim 6, wherein the phosphor layer is provided on the first reflecting surface.

8. The light emitting diode according to claim 6, wherein the phosphor layer is provided on the second reflecting surface.

9. The light emitting diode according to claim 6, wherein the second reflecting surface comprises an inclined reflecting surface of a side reflecting member provided around the light emitting element.

10. The light emitting diode according to claim 9, wherein the side reflecting member comprises a metallic material.

11. The light emitting diode according to claim 6, wherein the light emitting element is in contact with a light transparent material.

12. The light emitting diode according to claim 11, wherein the light transparent material comprises an epoxy resin.

13. A light emitting diode comprising:
    a light emitting element;
    a counter reflecting surface that includes an inner surface facing the light emitting element, provided opposite to a light emitting surface of the light emitting element;

a side reflecting member that includes an inclined reflecting surface; and a phosphor layer being provided on at least one of the inner surface of the counter reflecting surface and the inclined reflecting surface of the side reflecting member.

14. The light emitting diode according to claim 13, wherein a portion of light emitted from the light emitting element directly reaches the inclined reflecting surface.

15. The light emitting diode according to claim 13, wherein a center portion of a counter reflector is curved in a convex form toward the light emitting surface of the light emitting element.

16. The light emitting diode according to claim 13, wherein a peripheral edge of a counter reflector is curved in a convex form toward the light emitting surface of the light emitting element.

17. The light emitting diode according to claim 13, further comprising:

a light transparent material in contact with the light emitting element.

18. The light emitting diode according to claim 17, wherein the light transparent material is in contact with the inclined reflecting surface.

* * * * *